(12) United States Patent
Yamazaki et al.

(10) Patent No.: US 6,710,794 B1
(45) Date of Patent: Mar. 23, 2004

(54) LIGHT PRINT HEAD

(75) Inventors: Katsuyuki Yamazaki, Shizuoka-ken (JP); Toshiyuki Sekiya, Mishima (JP); Mitsuo Shiraishi, Shizuoka-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 149 days.

(21) Appl. No.: 09/649,574

(22) Filed: Aug. 29, 2000

(30) Foreign Application Priority Data

Aug. 31, 1999 (JP) .......................... 11-246496

(51) Int. Cl.$^7$ ................................. B41J 2/47
(52) U.S. Cl. ................... 347/237; 347/236; 347/224
(58) Field of Search ........................ 347/237, 236, 347/224

(56) References Cited

U.S. PATENT DOCUMENTS

| | | | |
|---|---|---|---|
| 5,177,405 A | 1/1993 | Kusuda et al. | 315/169.1 |
| 5,451,977 A | 9/1995 | Kusuda et al. | 345/44 |
| 5,969,744 A | * 10/1999 | Sakashita et al. | 347/237 |

FOREIGN PATENT DOCUMENTS

| | | |
|---|---|---|
| JP | 1-238962 | 9/1989 |
| JP | 2-208067 | 8/1990 |
| JP | 2-212170 | 8/1990 |
| JP | 3-20457 | 1/1991 |
| JP | 3-194978 | 8/1991 |
| JP | 3-268959 | * 11/1991 |
| JP | 4-5872 | 1/1992 |
| JP | 4-23367 | 1/1992 |
| JP | 4-296579 | 10/1992 |
| JP | 5-84971 | 4/1993 |
| JP | 9-240057 | * 9/1997 |

OTHER PUBLICATIONS

Japan Hard–copy '91 Memoir, "Proposal of Light Emission Element Array for Light Printer in Which Driving Circuits Have Been Integrated", (A–17) (Jul. 1991).

IEICE (Institute of Electronics, Information and Communication Engineers) Memoir, "Proposal of Self–Scanning Type Light Emission Element (SLED) Using PNPN Thyristor Structure" (Mar. 5, 1990).

* cited by examiner

Primary Examiner—Stephen Meier
Assistant Examiner—Lam Nguyen
(74) Attorney, Agent, or Firm—Fitzpatrick, Cella, Harper & Scinto

(57) ABSTRACT

SLED (Self-scanning type Light Emitting Diode) array chips of 56 pieces and one driving circuit which generates signals to drive the 56 SLED array chips are provided. A signal is generated by another driving circuit. A driving current control resistor which is connected in series to a common base of driving transistors is provided to variably adjust an input voltage value acting as a control signal of the driving circuit. Thus, a light emission array head, a driving level adjustment method of a driving signal for this head, and an image formation apparatus containing this head can be simplified.

19 Claims, 9 Drawing Sheets

LIGHT PRINT HEAD

BACKGROUND OF THE INVENTION

1. Field of the Invention

The present invention relates to a light emission array head, a method of adjusting a driving level of a driving signal for this head, and an image formation apparatus. In particular, the present invention relates to a light emission array head which is used as a recording light emission element to form a permanent visible image on a recording medium by an electrophotographic recording system, a method of adjusting a driving level of a driving signal for the light emission array head, and an image formation apparatus which contains the light emission array head.

2. Related Background Art

Conventionally, a self-scanning type LED (light emitting diode) array (called an SLED hereinafter) has been introduced in Japanese Patent Application Laid-Open Nos. 1-238962, 2-208067, 2-212170, 3-194978, 4-5872, 4-23367, 4-296579 and 5-84971, Japan Hard-copy Memoir 1991 (A-17)"Proposal of Light Emission Element Array for Light Printer in Which Driving Circuits Have Been Integrated", IEICE (Institute of Electronics, Information and Communication Engineers) Memoir (Mar. 5, 1990)"Proposal of Self-Scanning Type Light Emission Element (SLED) Using PNPN Thristor Structure", and the like. Thus, the SLED has been paid attention to as a recording light emission element (i.e., a light emission element used for image recording) for an image formation apparatus of an electrophotographic system.

FIG. 5 shows an example of this SLED. An operation of this SLED will be explained with reference to FIG. 5.

As shown in FIG. 5, the SLED is composed of transfer thyristors (i.e., thyristors used for data transfer) ST1 to ST5 which are cascaded and light emission thyristors (i.e., thyristors used for light emission) SL1 to SL5 which are cascaded. As shown in FIG. 5, gate signals of the respective thyristors are set to be common. The gates of the first thyristors SL1 and ST1 are connected to the input part of a signal ΦS, the gates of the second thyristors SL2 and ST2 are connected to the cathode of a diode connected to the terminal of the signal ΦS, and the gates of the third thyristors SL3 and ST3 are connected to the cathode of a next diode.

FIGS. 6A to 6F are timing charts showing control signals of the SLED and on/off states of the thyristors. Further, FIGS. 6A to 6F show an example that all elements are lit. Hereinafter, the data transfer and the light emission will be explained according to the timing charts shown in FIGS. 6A to 6F.

The data transfer is started by changing the level of the signal ΦS (FIG. 6A) from 0V to 5V. When the level of the signal ΦS reaches 5V, a voltage Va=5V, a voltage Vb=3.7V (it is assumed that forward voltage drop of the diode is 1.3V), a voltage Vc=2.4V, a voltage Vd=1.1V, and a voltage Ve and following=0V. Further, the gate voltage of the transfer thyristor ST1 is changed from 0V to 5V, and the gate voltage of the transfer thyristor ST2 is changed from 0V to 3.7V, and the gate voltages of the following thyristors are changed similarly.

In this state, by changing the level of a signal Φ1 (FIG. 6B) from 5V to 0V, potentials of the anode, cathode and gate of the transfer thyristor ST1 become 5V, 0V and 3.7V respectively, thereby satisfying an on condition of this thyristor. When the transfer thyristor ST1 is turned on, this thyristor ST1 is still in the on state even if the level of the signal ΦS is changed to 0V, thereby maintaining the voltage Va≅5V. This is because the signal ΦS is supplied through a resistor (not shown), and a potential between the anode and gate of the thyristor has substantially the same value when the thyristor is turned on.

Thus, even if the level of the signal ΦS is changed to 0V, the on condition of the first thyristor is maintained, and a first shift operation ends. In this state, when the level of a signal ΦI for the light emission thyristor (FIG. 6D) is changed from 5V to 0V, the condition same as the condition that the transfer thyristor is turned on is satisfied, whereby the light emission thyristor SL1 is turned on, and a first LED is lit. When the level of the signal ΦI is returned to 5V, a potential difference between the anode and cathode of the light emission thyristor becomes zero, and thus a minimum holding current of the thyristor can not be flowed, whereby the light emission thyristor SL1 is turned off.

Next, transfer of the on condition from the transfer thyristor ST1 to the transfer thyristor ST2 will be explained.

Since the level of the signal Φ1 is maintained to 0V even if the light emission thyristor SL1 is turned off, the transfer thyristor ST1 is still on, and the gate voltage of the transfer thyristor ST1 satisfies Va≅5V and Vb=3.7V. In this state, by changing the level of a signal Φ2 (FIG. 6C) from 5V to 0V, potentials of the anode, cathode and gate of the transfer thyristor ST2 become 5V, 0V and 3.7V respectively, whereby the transfer thyristor ST2 is turned on. After the transfer thyristor ST2 has been turned on, when the level of the signal Φ1 is changed from 0V to 5V, the transfer thyristor is turned off similarly to turning off of the light emission thyristor SL1.

Thus, the on condition is shifted from the transfer thyristor ST1 to the transfer thyristor ST2. Then, when the level of the signal ΦI is changed from 5V to 0V, the light emission thyristor SL1 is turned on, and the LED is lit. The reason why only the light emission thyristor corresponding to the transfer thyristor being on can emit the light is as follows. Namely, when the transfer thyristor is not on, since the gate voltages of the thyristors except for the thyristor adjacent to the thyristor being on are 0V, the on condition of the thyristor is not satisfied. With respect to the adjacent thyristor, when the light emission thyristor is turned on, the potential level of the signal ΦI becomes 3.4V (corresponding to forward voltage drop of the light emission thyristor). Thus, since a potential difference between the gate and cathode of the adjacent thyristor is zero, this thyristor can not be turned on.

It was explained in the above description that the light emission thyristor is turned on by shifting the level of the signal ΦI to 0V, whereby the LED is lit. In a practical image formation operation, it is of course necessary to control whether or not the LED is to be actually lit at such timing, in accordance with image data. Image data Dp shown in FIG. 6E and a signal ΦD shown in FIG. 6F represent such control. Namely, the logical sum of the signal ΦI and the image data Dp is obtained externally. Only when the image data Dp is 0V, a ΦI terminal of the SLED actually becomes 0V, whereby the light is emitted. When the image data Dp is 5V, the ΦI terminal of the SLED is maintained to 5V, whereby the light is not emitted.

Next, a packaging state of an SLED array head will be explained with reference to FIG. 7 which illustrates appearance of the head.

SLED semiconductor chips 511 are mounted on a base substrate 512 to which a print wiring board such as a glass epoxy board, a ceramic board or the like is used. A control signal is externally supplied to a lighting control circuit (driver IC) 514, whereby this circuit 514 generates a lighting control signal for the SLED semiconductor chips 511. An external control signal is input from a connector 513, power is input from a power supply circuit 532 through a power supply cable 531, and the input signal and power are supplied to each semiconductor.

Bonding wires 515 are connected to the SLED semiconductor chips 511, whereby the output signals $\Phi 1$, $\Phi 2$, $\Phi S$ and $\Phi I$ from the driver IC 514 and negative-electrode-side power (GND in this example) are input through these wires 515. Numeral 516 denotes a positive-electrode-side power supply pattern (+5V in this example) which is drawn on the base substrate 512. Numeral 517 denotes a silver paste which gives electrical conductivity between the positive-electrode-side power supply pattern 516 and a back electrode of the SLED semiconductor chip 511 and firmly adheres the pattern 516 to the chip 511.

The SLED array head which has the above structure and operates as above is used as a light writing device in an image formation apparatus which comprises an image reader unit including a CCD sensor or the like and a printer unit for performing image formation in an electrophotographic system based on image data from the image reader unit. Namely, the image formation apparatus causes an electrifier to primarily electrify a photosensitive drum, causes the SLED array head to form an electrostatic latent image on the photosensitive drum based on the image data, causes a development unit to develop this electrostatic latent image to form a toner image, and causes a transfer unit to transfer the toner image onto a recording medium and output this recording medium.

In such an LED array, the dispersion of light emission quantity causes the dispersion of pixel density. Namely, if there is the dispersion of light emission in each chip of the LED array, it directly influences a pixel density of an output image, thereby causing the dispersion of pixel density. Thus, for example, it is necessary to optimize a driving current of the driving circuit for each light emission thyristor such that a light emission quantity in case of causing each chip to emit light at a predetermined power supply voltage, a predetermined time width and a predetermined light emission control signal pattern comes to be within a predetermined range, thereby controlling the dispersion of light emission quantity to maintain the pixel density to a predetermined value.

Especially, in the SLED, not only the driving current for the light emission element (light emission thyristor) but also a driving current for the transfer thyristor causes an inequable light quantity. This is because, since the light emission thyristor has the semiconductor lamination structure same as that for the transfer thyristor, the transfer thyristor is lit when the light emission thyristor is turned on, and though this transfer thyristor is masked by a metal film there is leakage light in some measure from a space of such a mask.

Such the inequable light quantity due to the leakage light can be controlled by reducing the driving current of the transfer thyristor. However, when the driving current is reduced too much, the on state of the thyristor can not be maintained, whereby there is some fear that a normal transfer operation can not be performed.

Thus, it is possible to use a means for controlling the dispersion of light emission quantity by providing the highly specified LED array chip and driving circuit. However, even in this case, a yield factor is naturally deteriorated when a desired quality of the output image is high. Thus, such the means is undesirable because a manufacturing cost becomes very expensive.

As above, it is necessary to adjust also the driving current for the driving other than the driving of the light emission elements of the LED array, within an appropriate range.

Next, a driving system for adjusting the driving current proposed as above to control the dispersion of light emission quantity of the SLED will be explained. FIG. 8 is a block diagram showing an example of such the conventional driving system.

In FIG. 8, numeral 600 denotes each of SLED array chips, numeral 601 denotes a driving circuit, and numeral 603 denotes each of plural driving current limitation resistors. Incidentally, the plural SLED array chips (56 pieces in this case) are provided. The driving circuit 601 drives these 56 SLED array chips 600. The driving current limitation resistor 603 is provided to the collector of each of driving transistors Q61, Q62, Q63, . . . , in the driving circuit 601. Numeral 652 denotes a control IC, and numeral 602 denotes a DC power supply (+5V). A consumption current detector 604 which is externally connected measures a quantity of the driving currents flowing in the driving current limitation resistors 603.

In case of adjusting the driving current, the resistance of the driving current limitation resistor 603 is set to r1. In this state, a driving current Ir1 of each bit of the SLED array chips 600 is measured. Next, the resistance of the driving current limitation resistor 603 is changed to another value r2. In this state, a driving current Ir2 of each bit of the SLED array chips 600 is measured similarly.

According to such measured results, the values of the driving currents Ir1 and Ir2 to the two kinds of resistances r1 and r2 for each bit are plotted as shown in FIG. 9, and the relation between the resistance and the current is approximated by using the straight line extended between two points, whereby a resistance rx estimated to be able to obtain a desired current quantity Ix is calculated according to the approximation of the straight line.

The measurement and the approximation of the straight line same as those explained above are performed to all the SLED array chips, and the resistor having the calculated resistance rx is mounted as the driving current limitation resistor. Thus, by adjusting the resistance of the driving current limitation resistor, the dispersion of light emission quantity of the SLED array head is controlled within the predetermined range.

Conventionally, as above, the circuit structure to compensate the output current of the driving circuit is externally added for each SLED array chip, whereby the dispersion of light emission quantity among the chips and the dispersion of driving circuit characteristic are flexibly and exactly corrected.

However, in such the conventional structure for compensation, there are quite a lot of numbers n of chips (including the number of light emission elements) especially in a print head, whereby there are a lot of numbers of mounting parts. Thus, it is necessary to prepare many kinds of resistances to perform delicate adjustment, whereby there is a problem of inviting the rise of the execution cost.

Further, in the print head or the like, since the mounting form is high density and minute, also the structure to enable measurement of a driving current (i.e., the structure to shunt at a measurement-desired point) becomes minute, and a minute type is used as for the mounting resistor. In such the form, exchange working of the minute-type resistor is difficult, whereby there is another problem that the exchange working required many times in the above adjustment is extremely difficult and requires a long time.

For example, in a case where the chips of which number n=56 are provided for one device and the resistance of the current limitation resistor corresponding to each chip is adjusted by ten stages, the number of stock parts of the resistors which should be prepared is 560 in simplicity as for one device. Thus, even in this case, the frequency by which the resistor should be exchanged is necessary at least as many as 168 times (i.e., 56 chips×3 times).

In order to solve the above problems which originates in the exchange of the resistors and to facilitate the adjustment of the device, it is necessary to use the parts such as plural variable resistors or to prepare an expensive head mounting form by needlessly using a large substrate.

SUMMARY OF THE INVENTION

The present invention has been made in consideration of the above points, and an object thereof is to provide a light emission array head which solved the above problems, a method of adjusting a driving level of a driving signal for the light emission array head, and an image formation apparatus which contains the light emission array head.

To achieve the object, there is provided a light emission array head in which plural semiconductor chips each containing plural light emission elements arranged in a predetermined direction are arranged in the predetermined direction, and which causes the plural light emission elements of the plural semiconductor chips to emit light in accordance with a predetermined driving signal, the light emission array comprising:

driving means for driving the plural light emission elements in accordance with a predetermined control signal;

control means for generating the predetermined control signal, and controlling the plural semiconductor chips to operate at a predetermined control signal level and light emission pattern; and one adjustment means for adjusting in common a driving level of the predetermined driving signal by the driving means according to the predetermined control signal, wherein a consumption current consumed by the control means is subtracted from a total power supply consumption current measurement value in case of causing each of the plural semiconductor chips to perform a predetermined operation in accordance with the predetermined control signal sent from the control means, a driving current value supplied from the driving means to the semiconductor chip is calculated, and the adjustment by the adjustment means is performed, whereby the driving level of the driving signal can be adjusted to be within a predetermined range.

Other objects and features of the present invention will become apparent from the following detailed description and the attached drawings.

DETAILED DESCRIPTION OF THE PREFERRED EMBODIMENTS

Hereinafter, the embodiments of the present invention will be explained in detail with reference to the attached drawings.

First Embodiment

The present embodiment provides a structure to adjust a transfer thyristor current especially in an SLED array device (i.e., a light emission array head).

Figure 1:
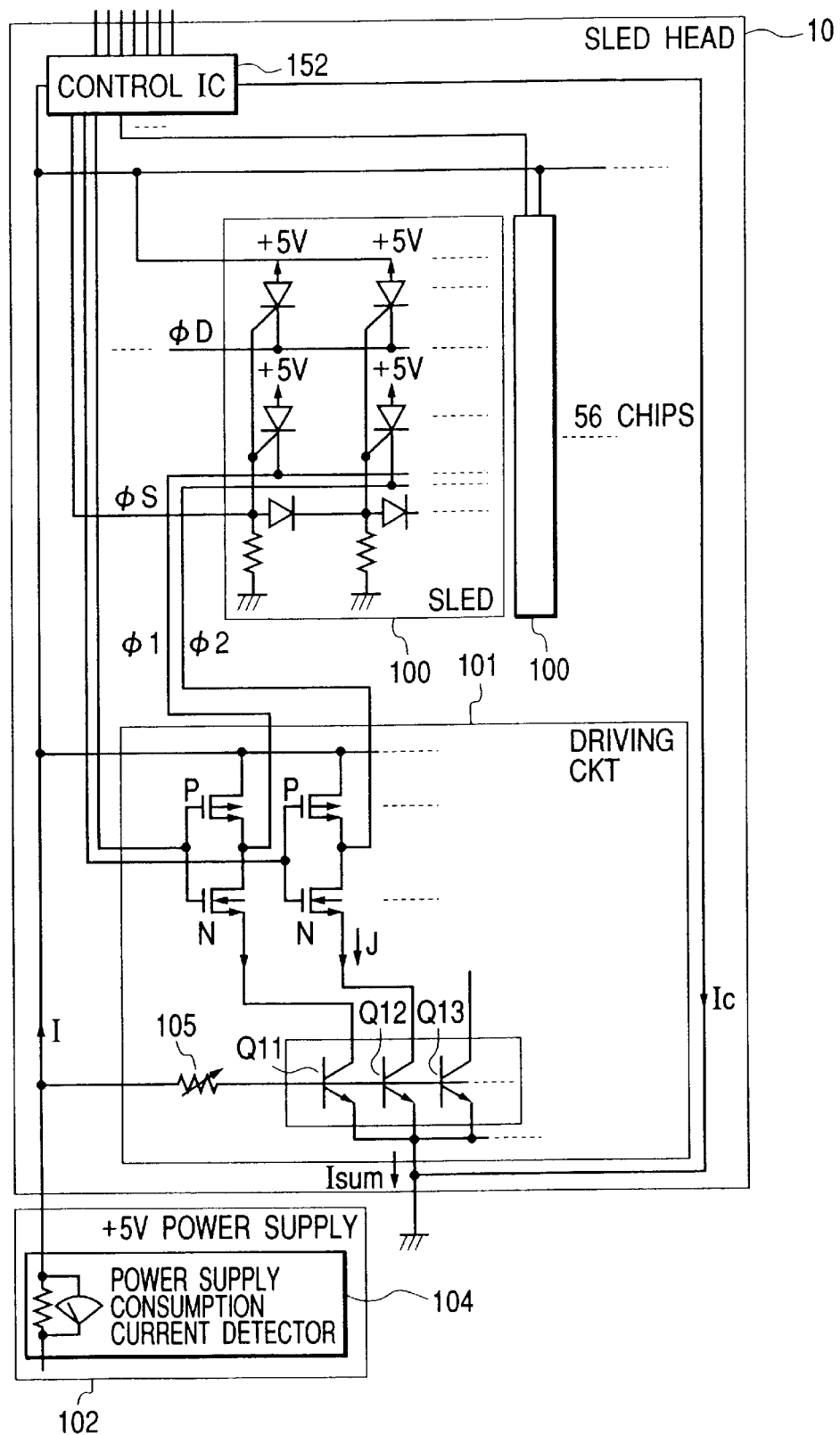
FIG. 1 is a block diagram showing the first embodiment concerning an SLED array device (a light emission array head) according to the present invention, and for explaining a driving level adjustment method of a driving signal of the light emission array head utilizing a variable resistor.

FIG. 1 is a block diagram showing the SLED array device according to the first embodiment of the present invention. This SLED array device applies a self-scanning type driving system.

Figure 5:
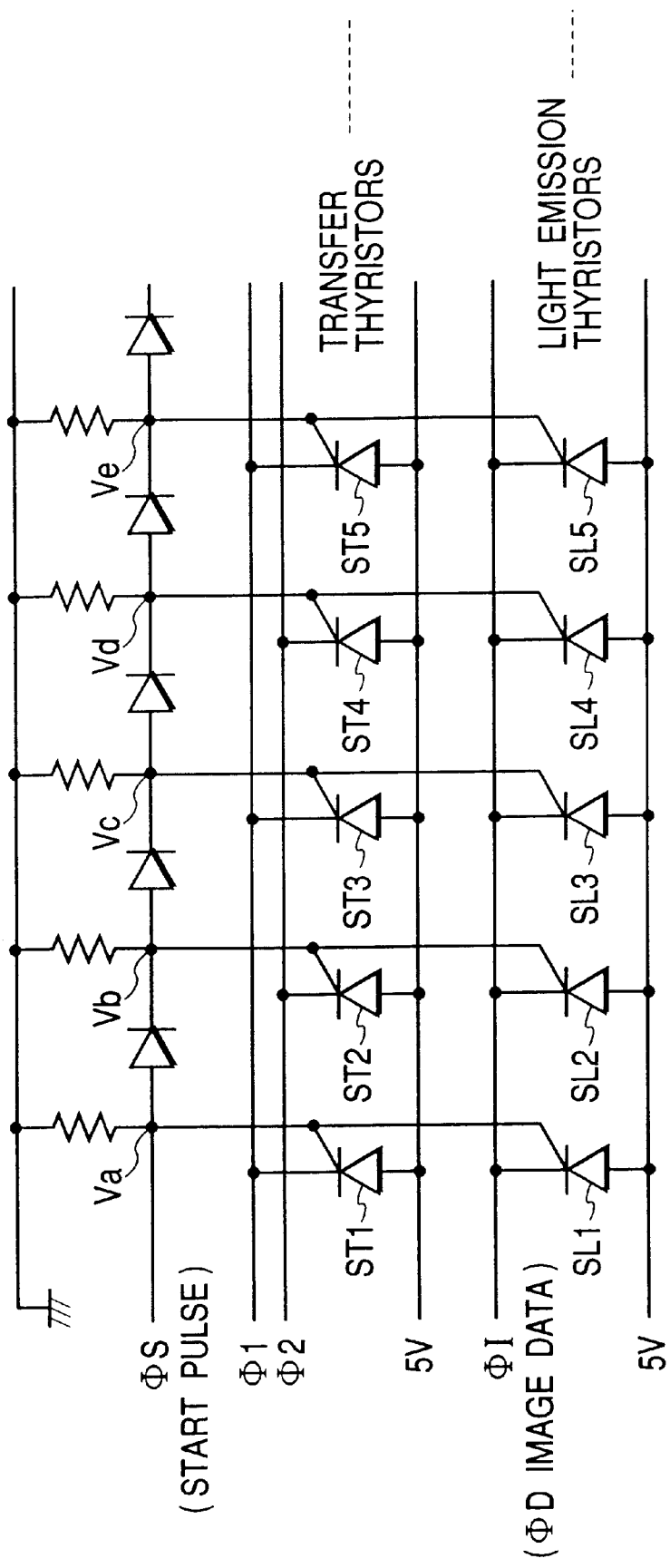
FIG. 5 is a circuit diagram showing an example of a basic structure of a self-scanning type LED array (called the SLED hereinafter)
Figure 6:
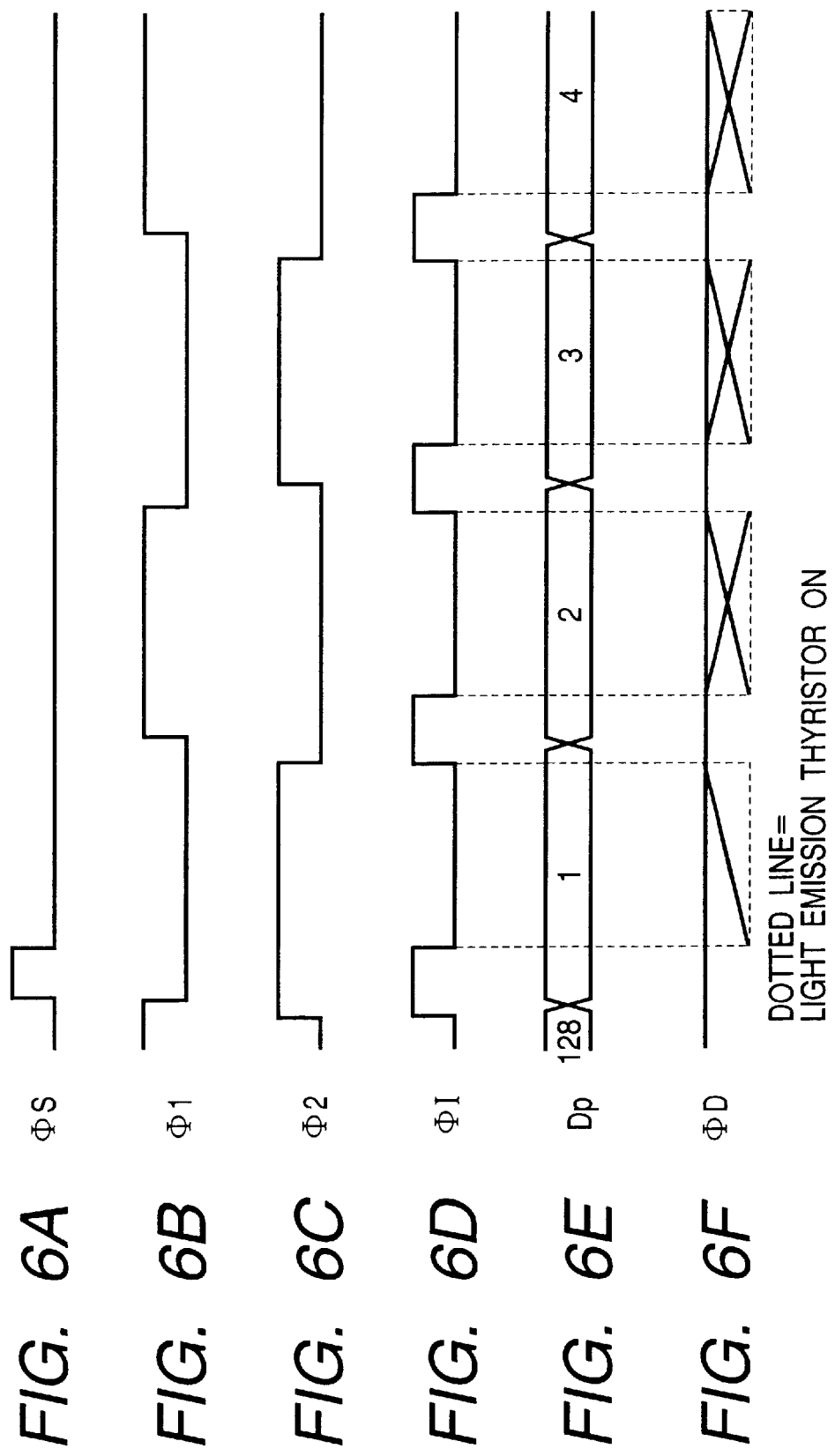
FIGS. 6A, 6B, 6C, 6D, 6E and 6F are timing charts showing examples of control signals used to control the SLED.
Figure 7:
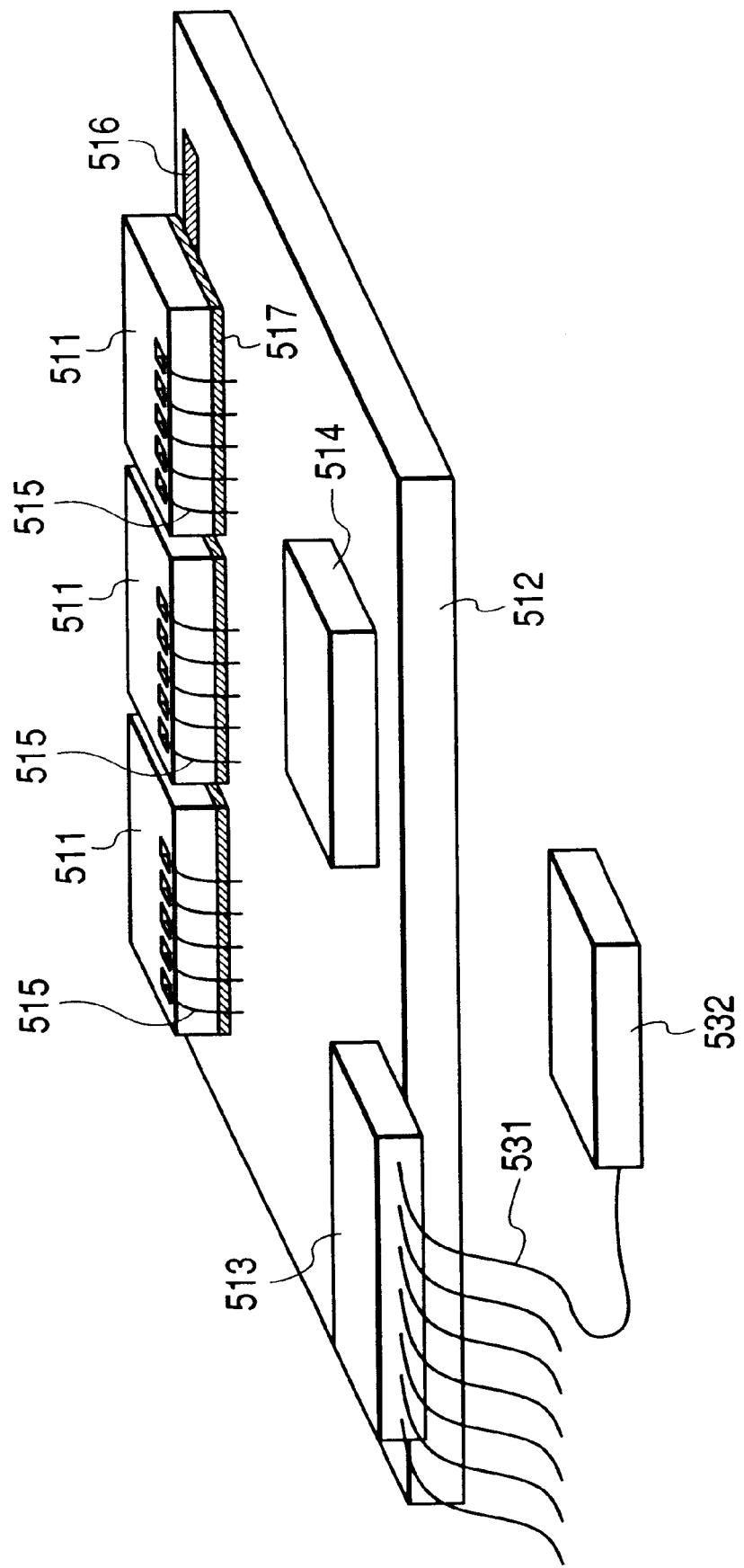
FIG. 7 is an appearance diagram showing an example of a mounting structure of the SLED array head.
Figure 8:
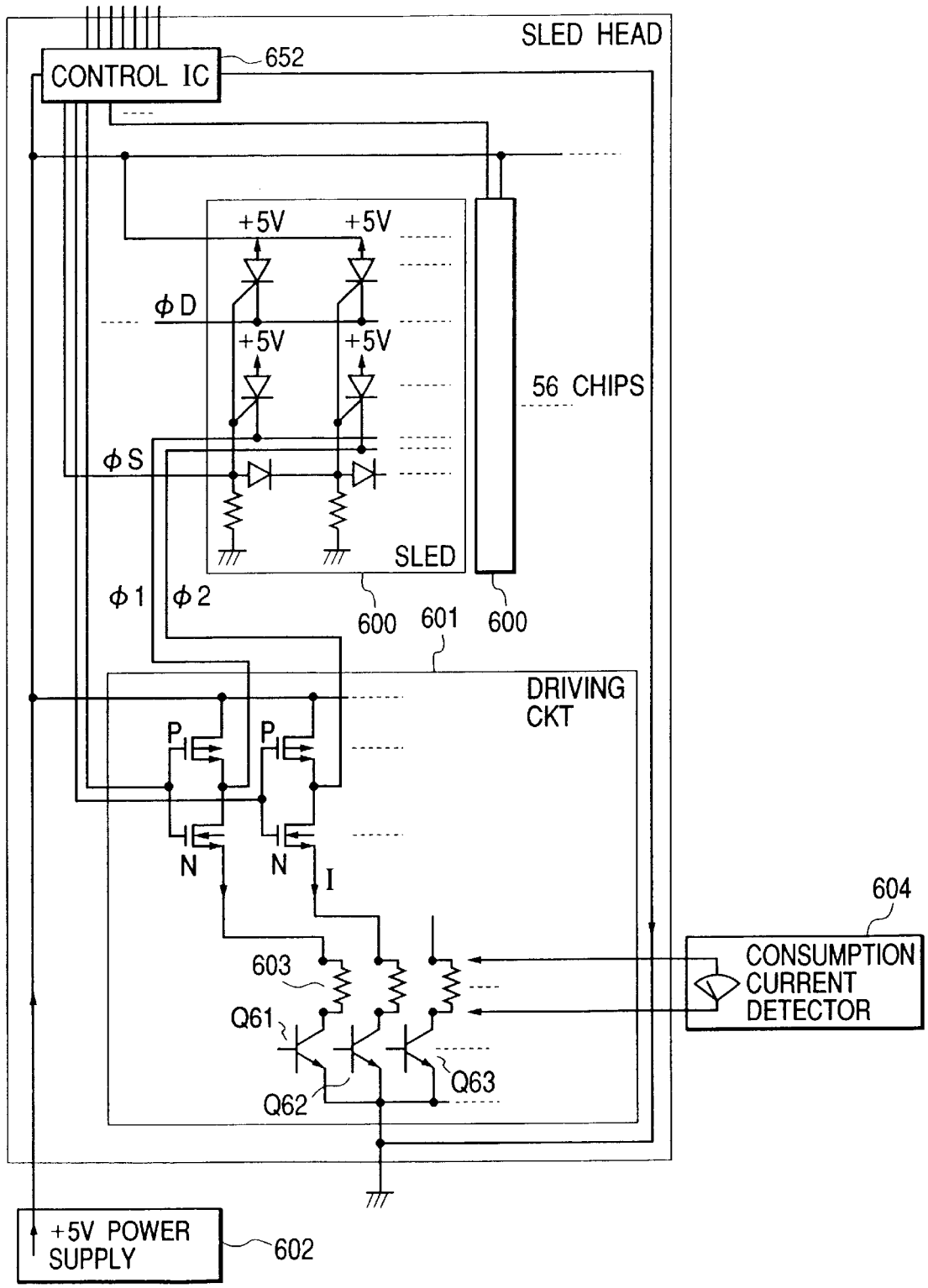
FIG. 8 is a block diagram showing an example of the SLED array device which executes a conventional current adjustment system to control the dispersion of SLED light emission quantity.
Figure 9:
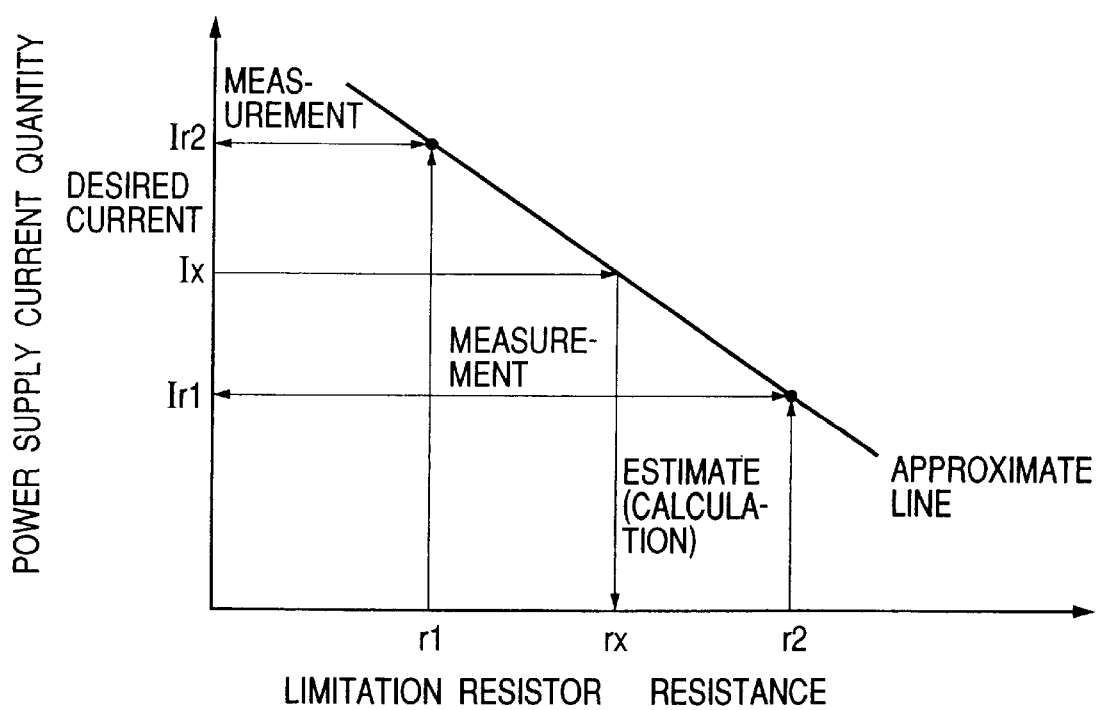
FIG. 9 is a characteristic diagram showing an example of the relation between a driving current quantity and driving current limitation resistance in the conventional example of FIG. 8.

In FIG. 1, numeral 100 denotes each of SLED array chips. The SLED array chips 100 are driven on the basis of control signals ($\Phi S$, $\Phi 1$, $\Phi 2$, $\Phi D$) already explained with reference to FIGS. 5 and 6. A transfer thyristor driving circuit 101 generates and outputs the transfer thyristor driving signals $\Phi 1$ and $\Phi 2$. The light emission thyristor driving signal $\Phi D$ is actually generated from a light emission thyristor driving circuit which is different from the transfer thyristor driving circuit 101. However, since this light emission thyristor driving circuit has the same structure as that of the transfer thyristor driving circuit 101, this circuit is omitted in FIG. 1 to simplify the entire explanation. Incidentally, the plural SLED array chips 100 (i.e., 56 pieces in this case) are provided.

The one driving circuit 101 is provided to drive these 56 chips. A driving capability of the driving circuit 101 changes according to the input control signal. A driving current control resistor 105 which is a single variable resistor is connected in series to the common base of plural driving transistors Q11, Q12, Q13, . . . , in the driving circuit 101. The driving current control resistor 105 is provided to variably adjust the input current value used as the control signal of the driving circuit 101.

Numeral 152 denotes a control IC. The control IC 152 controls each element in an SLED head 10 so as to operate the SLED array device at predetermined control signal level and light emission pattern. Numeral 102 denotes a DC power supply (+5V), and numeral 104 denotes a power supply consumption current detector.

In the above circuit structure, the driving current of the of the signals $\Phi 1$ and $\Phi 2$ for one chip of the SLED of the driving circuit 101 is assumed to be J, and the quantity of the power supply current supplied to the entire SLED head 10 including the control IC 152 is assumed to be I.

Figure 2:
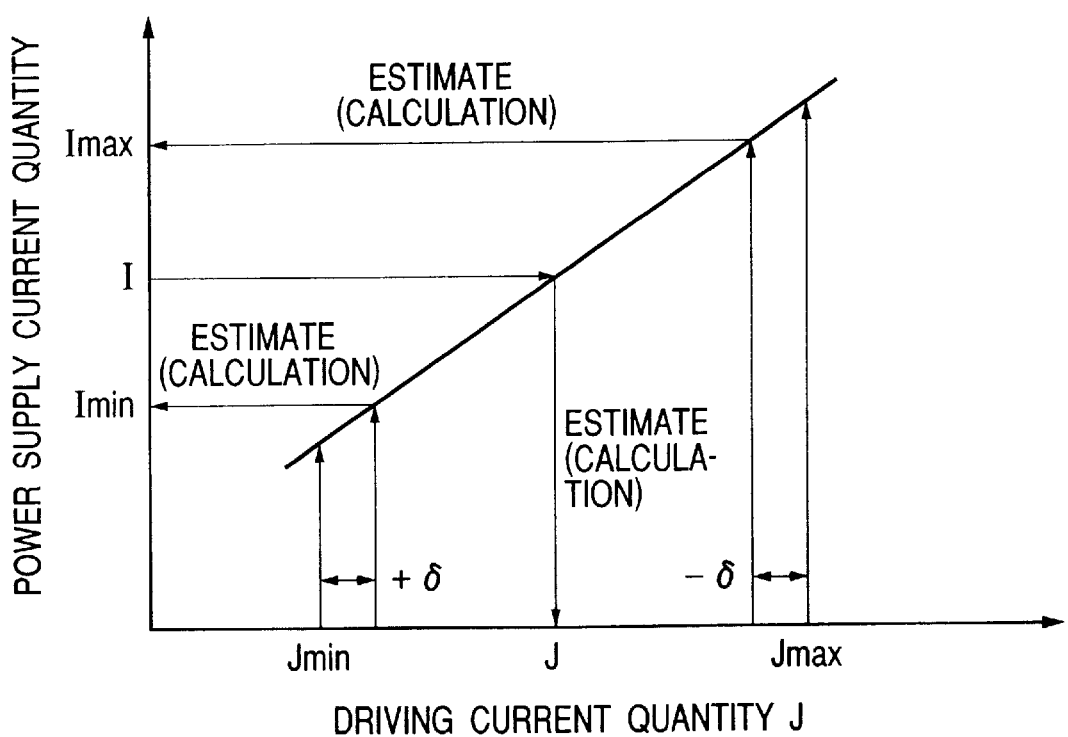
FIG. 2 is a characteristic diagram showing an example of the relation between a power supply consumption current quantity and a driving current quantity in the structure of FIG. 1.

FIG. 2 is a characteristic diagram showing the relation between the power supply current I (longitudinal axis) and the driving current J (lateral axis). Namely, FIG. 2 shows an example of the relation between the power supply current detected by the power supply consumption current detector 104 and the driving current of the driving circuit 101, which is obtained when the value of the driving current control resistor 105 is changed in the state that the SLED array device of FIG. 1 is operated at the predetermined control signal level and light emission pattern.

In a driving level adjustment method for the driving signal of the embodiment of the present invention, according to the above relation, the driving current is estimated from the power supply current by calculation, and the driving current is adjusted to be within a predetermined range for each chip according to the estimated result. Hereinafter, this driving level adjustment method will be explained.

First, under the control of the control IC 152, the SLED array device (the SLED head 10) is operated at the predetermined control signal level and light emission pattern. An operation condition in this case is assumed to include two condition, i.e., in one condition all the light emission is off, and in the other condition the light emission is performed in a known predetermined light emission quantity. At this time, a quantity of entire power supply currents of other circuits in the LED array device independent on the resistance of the driving current control resistor 105 is estimated. Such the estimation can be performed according to the entire circuit structure and circuit operation state, as follows.

The consumption current when the SLED array device operates is roughly divided into two kinds of currents, i.e., the current consumed to drive the SLED, and the current consumed by the control IC 152 to generate various signals. In the former current (consumed to drive the SLED), the driving current (i.e., the signal ΦD in FIG. 1) flowing when the light emission thyristor is on and the driving current (i.e., the signals Φ1 and Φ2 in FIG. 1) flowing when the transfer thyristor is on are predominant. Here, in the former consumption current, when the control signal to entirely turn off the light emission is given, the driving current for the light emission thyristor becomes almost 0, whereby the driving current for the transfer thyristor remains.

On the other hand, the latter current (consumed by the control IC 152) can be completely calculated because of its circuit structure. Then, according to the calculated result, the value of the power supply current I including the driving current quantity for the transfer thyristor can be calculated and estimated.

Further, when the SLED array device (the SLED head 10) is operated in such the control state that the light emission being entirely off as above in accordance with the control by the control IC 152, the value of the power supply current I is actually detected and measured by the power supply consumption current detector 104. Here, since the light emission is entirely off, it is possible to eliminate a measurement error which occurs due the a large driving current for the light emission. Then, by obtaining the difference between the estimated power supply current value and the above value actually measured, the current quantity dependent on the driving current control resistor 105, i.e., the sum of the driving current quantities within the driving circuit 101, is calculated. Such the sum which flows at the part represented by symbol Isum in FIG. 1 is given as J×the number 56 of chips.

The driving circuit 101 equally drives the functions of the plural SLED array chips 100 (56 pieces) according to the control signals Φ1 and Φ2. Thus, if the current quantity required by each chip is assumed to be almost the same, the quantity of the driving current J supplied to one chip can be obtained by dividing the sum (the value of the current Isum) of the driving current quantities within the driving circuit 101 by the number 56 of corresponding chips.

The base voltage of the driving transistors Q11 and Q12 is variably adjusted at an appropriate level by variably adjusting the resistance of the driving current control resistor 105 according to the above calculated result. Thus, it is possible to variably control the driving current quantity for each chip and to control for each chip the power supply current quantity based on a later-described predetermined setting range. Incidentally, instead of a bipolar transistor, an FET (field-effect transistor) can be used as the driving current control element to variably adjust the gate voltage.

Next, one example of the adjustment according to the above adjustment method will be concretely explained with reference to FIG. 2.

First, each operation parameter is assumed as follows. Namely, a constant power supply consumption current which is consumed by the control IC 152 in the light emission pattern where all the light emission thyristors are being off is assumed to be Ic [A], the number of SLED array chips which are simultaneously driven is assumed to be n [pieces], the value of the driving current to secure the transfer operation of the transfer thyristor is assumed to be Jmin [mA] or more, the value of the driving current by which an influence of a leakage light quantity by the transfer thyristor can be held within a tolerance (i.e., by which desired image quality can be obtained) is assumed to be Jmax [mA] or lower, and a dispersion range of the driving current which is estimated between the adjacent chips is assumed to be ±δ [mA].

When the SLED array with the chips of n pieces is driven by one driving circuit, the power supply current of the operation condition by which the transfer operation can be surely performed and the desired image quality can be obtained is calculated. In expectation of the above dispersion, the minimum power supply current is assumed to be Imin, and the maximum power supply current is assumed to be Imax, whereby the following expressions can be given.

Imin=(Jmin+δ)×n+Ic

Imax=(Jmax−δ)×n+Ic

Therefore, within the predetermined setting range where the value measured by the power supply consumption current detector 104 is Imin [A] or more and Imax [A] or lower, the resistance of the driving current control resistor 105 is variably adjusted according to an indication of the detector 104. By setting the resistance of the driving current control resistor 105 within this range, it is possible to normally perform the transfer operation, and it is also possible to hold the influence of the leakage light quantity within the tolerance. Incidentally, this setting range is based on the fact that the circuit of the SLED head 10 comprises the structure having a linearity in the relation between the driving current and the power supply current.

For example, if it is assumed that Ic=70 [mA], n=56 [pieces], Jmin=2.7 [mA], Jmax=3.4 [mA] and δ=±0.3 [mA], the following expressions can be given.

Imin=(2.7+0.3)×56+70=238 [mA]

Imax=(3.4−0.3)×56+70=243.6 [mA]

Thus, the resistance of the driving current control resistor 105 is variably adjusted such that the measured value by the power supply consumption current detector 104 enters within the range of 238 to 243.6 [mA].

Second Embodiment

Hereinafter, the second embodiment of the present invention will be explained with reference to the attached drawings.

The present embodiment provides a structure to automatically adjust a transfer thyristor current especially in an SLED array device (i.e., a light emission array head).

Figure 3:
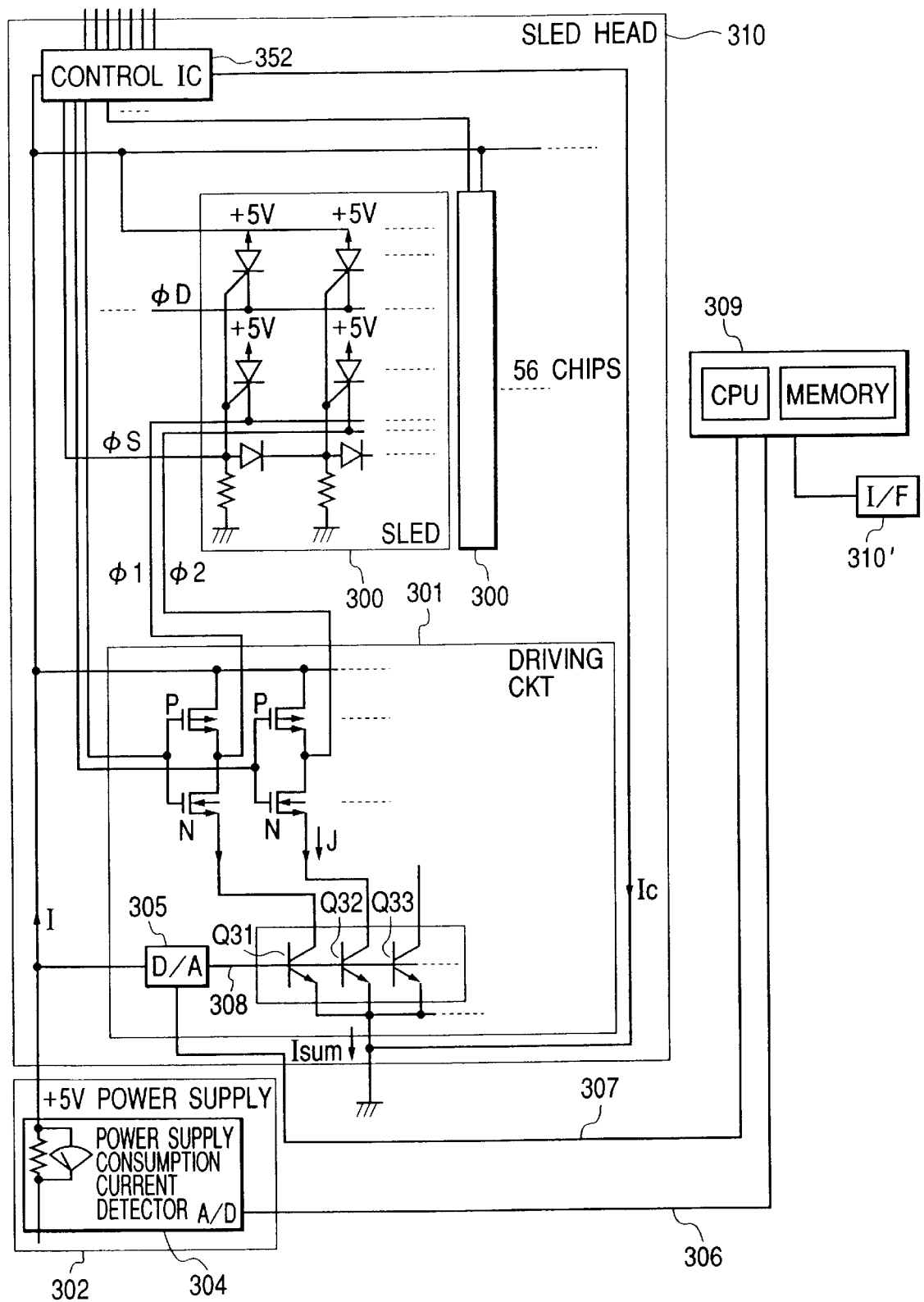
FIG. 3 is a block diagram showing the second embodiment.

FIG. 3 is a block diagram showing the SLED array device according to the second embodiment of the present invention. This SLED array device applies a self-scanning type driving system.

In FIG. 3, numeral 300 denotes each of SLED array chips.

The SLED array chips 300 are driven on the basis of control signals (ΦS, Φ1, Φ2, ΦD) already explained with reference to FIGS. 5 and 6A to 6F. A transfer thyristor driving circuit 301 generates and outputs the transfer thyristor driving signals Φ1 and Φ2. The light emission thyristor driving signal ΦD is actually generated from a light emission thyristor driving circuit which is different from the transfer thyristor driving circuit 301. However, since this light emission thyristor driving circuit has the same structure as that of the transfer thyristor driving circuit 301, this circuit is omitted in FIG. 3 to simplify the entire explanation. The plural SLED array chips 300 (i.e., 56 pieces in this case) are provided.

The one driving circuit 301 is provided to drive these 56 chips. A driving capability of the driving circuit 301 changes according to the input control signal. One D/A (digital-to-analog) converter 305 is connected in series to the common base of plural driving transistors Q31, Q32, Q33, . . . , in the driving circuit 301. The D/A converter 305 generates an output current according to the value of a driving capability value control digital signal 307 of the driving circuit 301, as a driving capability value control current signal 308.

Further, numeral 352 denotes a control IC. The control IC 352 controls each element in an SLED head 310 so as to operate the SLED array device at predetermined control signal level and light emission pattern. Numeral 302 denotes a DC power supply (+5V). Numeral 302 denotes an A/D (analog-to-digital) converter which outputs a power supply consumption current value digital signal 306.

Further, numeral 309 denotes a digital computer device which contains a CPU, an input interface for the power supply consumption current value digital signal 306, an output interface for the driving capability value control digital signal 307, and a memory for holding and storing programs and data. Numeral 310' denotes an operation interface (I/F) which is connected to the digital computer device 309 so as to externally operate or handle the SLED array device.

The relation between the power supply current I and the driving current J in the present embodiment is the same as that shown in FIG. 2 of the first embodiment. Namely, FIG. 2 shows the example of the relation between a current quantity detected by the A/D converter 304 and the driving current of the driving circuit 301, which is obtained when the current quantity of the driving capability value control current signal 308 is changed and the driving capability of the driving circuit 301 is changed in accordance with the driving capability value control digital signal 307 in the state that the SLED array device of FIG. 3 is operated at the predetermined control signal level and light emission pattern. Thus, according to this relation, the driving current is estimated from the power supply current by calculation.

Since the detail of this estimation process is the same as that in the first embodiment, the explanation thereof will be omitted. The estimated result can be obtained as current values Imin and Imax according to the expressions described above.

The power supply current value Imin is calculated from a minimum driving current value Jmin by which the transfer thyristor secures the transfer operation.

By the power supply current value Imax, the influence of a leakage light quantity of the transfer thyristor can be held within a tolerance (i.e., desired image quality can be obtained). The current value Imax is calculated from a driving current value Jmax.

In the present embodiment, since parameters which are used in the estimation calculation are fixed, these parameters can be calculated beforehand at a design stage. As a result, the calculated results Imin and Imax are written in a non-volatile memory of the digital computer device 309 as digital values which can be compared with the value of the power supply consumption current value digital signal 306 of the A/D converter 304.

Figure 4:
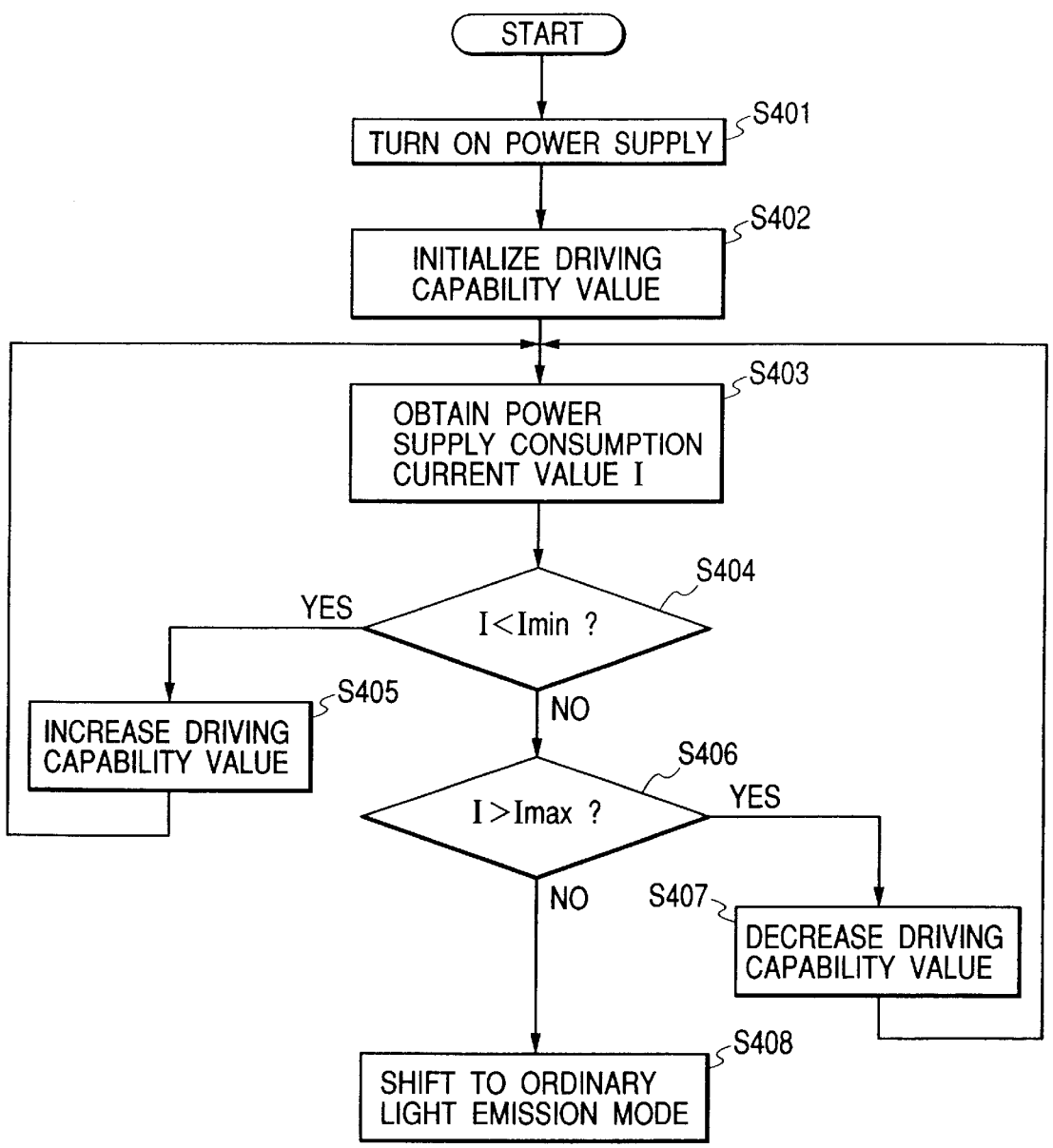
FIG. 4 is a flow chart showing the second embodiment.

Hereinafter, a driving level adjustment method for the driving signal according to the present embodiment wherein the driving current is adjusted for each chip to be within a predetermined range on the basis of the above calculated result will be explained with reference to a flow chart of FIG. 4.

The digital computer device 309 includes two mode states (an ordinary light emission mode, and a current adjustment mode). After the power supply was turned on (S401), in a predetermined sequence, the digital computer device 309 enters the current adjustment mode in response to an instruction from the I/F 310' (S402).

In the current adjustment mode, as the first step, the digital computer device 309 obtains the power supply consumption current value I as the power supply consumption current value digital signal 306 through the A/D converter 304 (S403).

As the second step, the digital computer device 309 compares the obtained value I with the power supply current value Imin in the memory (S404). If I<Imin, the value of the driving capability value control digital signal 307 is increased to increase the power supply current value (S405), and the flow returns to the first step (S403). If I≧Imin, the flow advances to the third step (S406).

As the third step, the digital computer device 309 compares the power supply current value Imax in the memory with the obtained value I (S406). If I>Imax, the value of the driving capability value control digital signal 307 is decreased to decrease the power supply current value (S407), and the flow returns to the first step. Conversely, if I≦Imax, the current adjustment mode ends, and the digital computer device 309 enters the ordinary light emission mode (S408).

Thus, the power supply consumption current value I is adjusted to be held within the range between the values Imin and Imax.

In the above control, it is necessary to instruct increase and decrease of the current value in the unit smaller than |Imax−Imin| for convergence. Further, in the above control, to accelerate the convergence, an initial value of the current value should be adjusted to a value which is fairly close to the target value.

In the present embodiment, the previously calculated value has been written as the estimation value in the nonvolatile memory. However, when the parameter used in the calculation for the estimation is variable according to the state of the device, such the calculation may be performed by the digital computer device 309.

According to the above embodiments of the present invention, an average state of the driving currents for the plural SLED chips is detected based on the measured value and the estimated value (the calculated value) of the power supply total consumption current including the sum of the consumption currents of the respective chips. Thus, by collectively correcting the dispersion of light quantities of the chips and the dispersion of characteristics of the driving circuit, it is possible to easily solve the conventional problems with the simple structure as compared with the conventional case, without any complicated resistor exchange working. Namely, it is possible by controlling the dispersion of light emission quantity for each SLED chip to realize the light emission array head by which the desired image quality can be obtained, the method of adjusting the driving level of the driving signal for this light emission array head, and an image formation apparatus which contains this light emission array head, easily and cheaply.

In the above embodiments, the LED array light emission device (the light emission array device) and the driving level adjustment method for this device were explained. Further, it is possible to provide a photosensitive drum (a rotative photosensitive body) which is rotatively driven around a rotative axis (rotation center) substantially parallel with a main scan direction (a light emission element arrangement direction) by performing main scanning to cause plural light emission elements to emit light according to image data, and uniformly electrified by an electrifier. In this case, a light writing line is repeatedly formed on the photosensitive drum by using the LED array light emission device according to the present invention, and light scanning is performed such that the formed light writing line is relatively moved at predetermined speed in a sub scan direction substantially perpendicular to the main scan direction on the photosensitive drum, whereby an electrostatic latent image can be formed.

This electrostatic latent image is developed by using toner, thus obtained toner image is transferred to a recording sheet or the like carried by a known carrying means, and the transferred image is fixed by a fixing unit, whereby an output image can be obtained. Namely, the present invention is applicable to an image formation apparatus of electrophotographic recording system. Further, the present invention is also applicable to a color image formation apparatus which contains a light emission array head, a photosensitive drum, a rotative driving means for driving this drum and a light scanning means for forming an electrostatic latent image such that a electrophotographic process is performed to each of different colors, e.g., C (cyan), M (magenta), Y (yellow) and K (black).

As explained above, according to the above embodiments, in the light emission array head (SLED array device) which contains the plural semiconductor chips each containing plural light emission elements, it is possible to easily solve the problems of the cost and working in the conventional method that the individual measurement and adjustment are repeated, by operating the plural semiconductor chips at the predetermined control signal level and light emission pattern to adjust the level of the driving signal to be within the predetermined range. Thus, it is possible by the simple and low-cost means to control the dispersion of light emission quantity as maintaining the desired-quality image.

Although the present invention has been explained by use of the several preferred embodiments, the present invention is not limited to these embodiments. Namely, it is obvious that various modifications and changes are possible in the present invention without departing from the spirit and scope of the appended claims.

What is claimed is:

1. A light emission array head in which plural semiconductor chips each containing plural light emission elements arranged in a predetermined direction are arranged in the predetermined direction, and which causes said plural light emission elements of said plural semiconductor chips to emit light in accordance with a predetermined driving signal, said light emission array head comprising:

driving means for driving said plural light emission elements in accordance with a predetermined control signal;

control means for generating the predetermined control signal, and controlling said plural semiconductor chips to operate at a predetermined control signal level and light emission pattern;

one adjustment means for adjusting in common a driving level of the predetermined driving signal by said driving means according to the predetermined control signal; and current measuring means for measuring a total power supply consumption current, wherein a consumption current consumed by said control means is subtracted from the total power supply consumption current measured by said current measuring means in case of causing each of said plural semiconductor chips to perform a predetermined operation in accordance with the predetermined control signal sent from said control means, a driving current value supplied from said driving means to said semiconductor chip is calculated, and the adjustment by said adjustment means is performed, whereby the driving level of the driving signal can be adjusted to be within a predetermined range.

2. A light emission array head according to claim 1, wherein, by the control of said control means, said plural semiconductor chips are driven by changing a driving capability of said driving means in accordance with said predetermined control signal level and light emission pattern.

3. A light emission array head according to claim 1, further comprising:

first calculation means for calculating a predetermined power supply current to be supplied to said semiconductor chip in the predetermined operation;

current measurement means for obtaining an actually measured value of a power supply current supplied to said semiconductor chip in the predetermined operation; and second calculation means for calculating a driving signal level for each of said plural semiconductor chips on the basis of the calculated predetermined power supply current and the actually measured value.

4. A light emission array head according to claim 1, wherein said plural light emission elements provide plural-bit transfer thyristors arranged as an array, the driving signal being input to each cathode of said transfer thyristor through said driving means, and plural-bit light emission thyristors arranged as an array, a gate of said light emission thyristor and a gate of said each-bit transfer thyristor being connected in common, said each-bit transfer thyristor is sequentially set to be in a light emission state in response to the driving signal, said light emission thyristor corresponding to said transfer thyristor set to be in the light emission state is set to be in the light emission state in accordance with a potential of a start pulse supplied from said control means to the common gate, and said light emission array head further comprises third calculation means for obtaining the predetermined range to cause said plural light emission elements to perform predetermined light emission operation and transfer operation.

5. A driving level adjustment method for a driving signal which is used in a light emission array head in which plural semiconductor chips each containing plural light emission elements arranged in a predetermined direction are arranged in the predetermined direction, and which array head causes a driving means to drive the plural semiconductor chips to cause the plural light emission elements to emit light by using the driving signal according to a control signal from a control means, said method comprising:

an operation control step of causing by the control means the plural semiconductor chips to perform a predetermined operation at a predetermined control signal level and light emission pattern;

a power supply current obtaining step of measuring an actual value of a total power supply consumption current supplied to the semiconductor chips in the predetermined operation;

a driving current calculation step of subtracting a consumption current consumed by the control means from the actually measured value to calculate a value of the driving current to be supplied from the driving means to the semiconductor chips; and an adjustment step of adjusting a driving level of the driving signal of the plural semiconductor chips to be within a predetermined range, by adjusting the control signal based on the calculated driving current value.

6. A method according to claim 5, wherein
the light emission array head is a self-scanning type light emission array head, and said method further comprises a step of obtaining the predetermined range to cause the plural light emission elements to perform predetermined light emission operation and transfer operation.

7. An image formation apparatus comprising:

a light emission array head in which plural semiconductor chips each containing plural light emission elements arranged in a predetermined direction are arranged in the predetermined direction, and which causes said plural light emission elements of said plural semiconductor chips to emit light in accordance with a predetermined driving signal, said light emission array comprising, driving means for driving said plural light emission elements in accordance with a predetermined control signal, control means for generating the predetermined control signal, and controlling said plural semiconductor chips to operate at a predetermined control signal level and light emission pattern, one adjustment means for adjusting in common a driving level of the predetermined driving signal by said driving means according to the predetermined control signal; and current measuring means for measuring a total power supply consumption current,
wherein a consumption current consumed by said control means is subtracted from the total power supply consumption current measured by said current measuring means in case of causing each of said plural semiconductor chips to perform a predetermined operation in accordance with the predetermined control signal sent from said control means, a driving current value supplied from said driving means to said semiconductor chip is calculated, and the adjustment by said adjustment means is performed, whereby the driving level of the driving signal can be adjusted to be within a predetermined range;

a rotative photosensitive body having a rotative axis substantially parallel with the predetermined direction;

rotative driving means for rotatively driving said rotative photosensitive body; and scanning means for repeatedly forming a light writing line on said rotating rotative photosensitive body by performing main scanning to cause the plural light emission elements to emit light according to image data, and performing light scanning such that the formed light writing line is relatively moved at predetermined speed in a sub scan direction substantially perpendicular to the main scan direction on the rotative photosensitive body.

8. An image formation apparatus according to claim 7, wherein said light emission array head, said rotative photosensitive body, said rotative driving means and said scanning means are provided for each image data of different color.

9. A print device comprising:

plural SLED (Self-scanning type Light Emitting Diode) chips, each of said plural SLED chips including a light emission element array and a switching element array for switching said light emission element array;

control means for controlling said plural SLED chips;

adjustment means for adjusting currents of said plural SLED chips by a common element; and current measuring means for measuring a total power supply consumption current, wherein said adjustment means adjusts the currents of said plural SLED chips based on a consumption current consumed by said control means and the total power supply consumption current measured by said current measuring means, the total power supply consumption current being measured when said control means controls said plural SLED chips to perform a predetermined operation.

10. A print device according to claim 9, wherein said control means controls said plural SLED chips by a control signal, wherein the control signal includes a transfer signal to perform sequential transferring for the light emission elements.

11. A according to claim 10, wherein the common element of said adjustment means is a variable resistor.

12. A print device according to claim 9, wherein the currents adjusted by said adjustment means are currents of the switching element arrays.

13. A print device comprising:

plural light emission element array chips;

control means for controlling said plural light emission element array chips;

adjustment means for adjusting currents of said plural light emission element array chips by a common element; and current measuring means for measuring a total power supply consumption current, wherein said adjustment means adjusts the currents of said plural light emission element array chips based on a consumption current consumed by said control means and the total power supply consumption current measured by said current measuring means, the total power supply consumption current being measured when said control means controls said plural light emission element array chips to perform a predetermined operation.

14. A print device according to claim 13, wherein the common element of said adjustment means is a variable resistor.

15. A print device comprising:

plural light emission element array chips;

a controller for controlling said plural light emission element array chips; and an adjustment circuit for adjusting currents of said plural light emission element array chips by a common element, wherein said adjustment circuit adjusts the currents of said plural light emission element array chips based on a consumption current consumed by said controller and a total power supply consumption current measured by a current measuring device, the total power supply consumption current being measured when said controller controls said plural light emission element array chips to perform a predetermined operation.

16. A print device according to claim 15, wherein the common element of said adjustment circuit is a variable resistor.

17. A print device comprising:

plural light emission element array chips;

a controller for controlling said plural light emission element array chips;

an adjustment circuit for adjusting currents of said plural light emission element array chips; and a current measuring device for measuring a total power supply consumption current, wherein said adjustment circuit adjusts the currents of said plural light emission element array chips based on a consumption current consumed by said controller and the total power supply consumption current measured by said current measuring device, the total power supply consumption current being measured when said controller controls said plural light emission element array chips to perform a predetermined operation.

18. A print device comprising:

a SLED (Self-scanning type Light Emitting Diode) chip, said SLED chip including a light emission element array and a switching element array for scanning said light emission element array;

a controller for controlling said SLED chip;

an adjustment circuit for adjusting a current of said SLED chip; and current measuring device for measuring a total power supply consumption current, wherein said adjustment circuit adjusts the current of said SLED chip based on a consumption current consumed by said control means and the total power supply consumption current measured by said current measuring device, the total power supply consumption current being measured when said controller controls said SLED chip to perform a predetermined operation.

19. A print device according to claim 18, wherein the current adjusted by said adjustment circuit is a current of the switching element array.

* * * * *

UNITED STATES PATENT AND TRADEMARK OFFICE
CERTIFICATE OF CORRECTION

PATENT NO. : 6,710,794 B1
DATED : March 23, 2004
INVENTOR(S) : Katsuyuki Yamazaki et al.

It is certified that error appears in the above-identified patent and that said Letters Patent is hereby corrected as shown below:

Column 14,
Line 63, "A" should read -- A print device --.

Signed and Sealed this

Thirteenth Day of July, 2004

JON W. DUDAS
*Acting Director of the United States Patent and Trademark Office*